United States Patent
Killi et al.

(10) Patent No.: US 10,727,639 B2
(45) Date of Patent: Jul. 28, 2020

(54) IMPINGEMENT COOLING DEVICE FOR A LASER DISK AND ASSOCIATED LASER DISK MODULE

(71) Applicant: TRUMPF LASER GMBH, Schramberg (DE)

(72) Inventors: Alexander Killi, Trossingen (DE); Vincent Kuhn, Schiltach (DE)

(73) Assignee: TRUMPF LASER GMBH, Schramberg (DE)

(*) Notice: Subject to any disclaimer, the term of this patent is extended or adjusted under 35 U.S.C. 154(b) by 0 days.

(21) Appl. No.: 16/148,269

(22) Filed: Oct. 1, 2018

(65) Prior Publication Data

US 2019/0036291 A1    Jan. 31, 2019

Related U.S. Application Data

(63) Continuation of application No. PCT/EP2017/056992, filed on Mar. 23, 2017.

(30) Foreign Application Priority Data

Apr. 5, 2016  (DE) .................. 10 2016 205 638

(51) Int. Cl.
*H01S 3/04* (2006.01)
*H01S 3/06* (2006.01)
(Continued)

(52) U.S. Cl.
CPC ............ *H01S 3/0407* (2013.01); *H01S 3/042* (2013.01); *H01S 3/0405* (2013.01); *H01S 3/0604* (2013.01); *H01L 23/4735* (2013.01)

(58) Field of Classification Search
CPC ...... H01S 3/0407; H01S 3/042; H01S 3/0604; H01S 3/0405; H01L 23/4735
See application file for complete search history.

(56) References Cited

U.S. PATENT DOCUMENTS 4,552,439 A      11/1985  Hoag et al.
6,339,605 B1 *   1/2002   Vetrovec .................. H01S 3/025
                                                      359/333
(Continued)

FOREIGN PATENT DOCUMENTS

CN    1870880     7/2013
CN    103219645   7/2013
(Continued)

OTHER PUBLICATIONS

International Search Report and Written Opinion in Application No. PCT/EP2017/056992, dated Jun. 7, 2017, 23 pages (with English translation).

(Continued)

*Primary Examiner* — Xinning(Tom) Niu
(74) *Attorney, Agent, or Firm* — Fish & Richardson P.C.

(57) ABSTRACT

Impingement cooling devices for a laser disk include a carrier plate on the front side of which the laser disk can be secured, and a supporting structure, on the front side of which the rear side of the carrier plate is secured. The supporting structure has a plurality of cooling liquid feed lines from which the cooling liquid emerges in the direction of the rear side of the carrier plate and a plurality of cooling liquid return lines. The feed and return lines run parallel to one another in the longitudinal direction of the supporting structure, and the supporting structure includes a plurality of cutouts or the rear side of the carrier plate that are open toward the supporting structure, and the cooling liquid feed lines lead into and the cooling liquid return lines lead away from the plurality of cutouts.

10 Claims, 6 Drawing Sheets

(51) Int. Cl.
*H01S 3/042* (2006.01)
*H01L 23/473* (2006.01)

(56) References Cited

U.S. PATENT DOCUMENTS

| | | | |
|---|---|---|---|
| 6,747,789 B2 | 6/2004 | Huonker et al. | |
| 7,075,959 B1 | 7/2006 | Downing et al. | |
| 8,755,416 B2 | 6/2014 | Zhu et al. | |
| 9,147,991 B2 | 9/2015 | Stolzenburg et al. | |
| 2006/0266497 A1* | 11/2006 | Berger | H01L 23/4735 165/80.4 |
| 2007/0297469 A1 | 12/2007 | Brown | |
| 2010/0074285 A1 | 3/2010 | Stephens et al. | |
| 2012/0063091 A1 | 3/2012 | Dede et al. | |
| 2012/0250719 A1* | 10/2012 | Hodgson | H01S 3/042 372/70 |
| 2013/0248153 A1 | 9/2013 | Sauciuc | |
| 2014/0190665 A1 | 7/2014 | Joshi et al. | |
| 2015/0043164 A1 | 2/2015 | Joshi | |

FOREIGN PATENT DOCUMENTS

| | | |
|---|---|---|
| CN | 105305206 | 2/2016 |
| DE | 102013211977 | 10/2014 |
| EP | 1213801 | 6/2002 |
| WO | WO 2011130897 | 10/2011 |

OTHER PUBLICATIONS

International Preliminary Report on Patentability in International Application No. PCT/EP2017/056992, dated Oct. 18, 2018, 10 pages (English translation).
CN Office Action in Chinese Appln. No. 201780021959.5, dated Nov. 28, 2019, 16 pages (with English translation).

\* cited by examiner

IMPINGEMENT COOLING DEVICE FOR A LASER DISK AND ASSOCIATED LASER DISK MODULE

CROSS REFERENCE TO RELATED APPLICATIONS

This application is a continuation of and claims priority under 35 U.S.C. § 120 from PCT Application No. PCT/EP2017/056992 filed on Mar. 23, 2017, which claims priority from German Application No. DE 10 2016 205 638.7, filed on Apr. 5, 2016. The entire contents of each of these priority applications are incorporated herein by reference.

TECHNICAL FIELD

The invention relates to an impingement cooling device for a laser disk.

BACKGROUND

Usually, laser disks are glued onto disk-shaped heat sinks (disk carriers) that are cooled on the rear side by impingement flow. The thermomechanical properties of the disk carrier substantially determine the thermal lens effect of the laser disk. This leads to demanding requirements for the thermal conductivity and stiffness of the disk carrier, which is therefore made of chemical vapor deposition (CVD) diamond. For higher laser power outputs, this leads to thicker diamond disks and high production costs. In other words, greater stiffness with almost the same heat resistance is achieved by ever thicker diamond disks.

An impingement cooling device disclosed in US 2014/0190665 A1 has a single cutout adjoining the rear side of the carrier plate, and radially running return lines.

In the impingement cooling device disclosed in WO 2011/130897 A1, a laser disk is mounted on a carrier plate, which at the same time forms a resonator mirror of a laser resonator. A cooling liquid emerging from a nozzle opening impinges on the self-supporting rear side of the carrier plate, which is thereby cooled.

EP 1 213 801 A2 discloses a cooling device in which the laser-active solid body is cooled directly with cooling water on its rear side, which is provided with a covering layer.

U.S. Pat. No. 6,339,605 B1 discloses a cooling arrangement for a laser disk mounted on a copper substrate. A cooling liquid flows through the copper substrate and is conducted into micro-channels of the copper substrate that are open toward the laser disk. The rear side of the laser disk is consequently cooled by the cooling liquid flowing through the micro-channels.

Furthermore, US 2007/0297469 A1 discloses a cooling arrangement for a laser disk mounted on a carrier plate of diamond or sapphire. Within the carrier plate, micro-channels for a cooling liquid run near the surface.

SUMMARY

Advantages of the current disclosure include an impingement cooling device with a greater stiffness of the carrier plate and at the same time almost the same heat resistance of the carrier plate, without having to increase the thickness of the (diamond) carrier plate. These advantages are achieved by a carrier plate configured to secure the laser disk on a front side and having a rear side, an impingement cooling area for cooling the carrier plate by a cooling liquid, a supporting structure secured on a front side thereof to the rear side of the carrier plate. The supporting structure has a plurality of cooling liquid feed lines from which the cooling liquid emerges towards the rear side of the carrier plate, feed and return lines that run parallel to one another in the longitudinal direction of the supporting structure. A plurality of cutouts in a region adjoining the rear side of the carrier plate that are closed toward the rear side of the carrier plate, and the cooling liquid feed lines lead into the plurality of cutouts and the cooling liquid return lines lead away from the plurality of cutouts and wherein the feed lines are each formed by a separate tube that is arranged in a through-channel of the supporting body, and the return lines in the supporting body are respectively formed by a gap between the through-channel and the tube, or vice versa In one aspect, a carrier plate (for example of diamond material) is attached to a stiffening rear-side supporting structure (for example of tungsten carbide or aluminum nitride) through which cooling liquid flows to retain the small heat resistance of a diamond heat sink. Since the heat resistance of the supporting structure does not influence the temperature of the laser disk, materials with great stiffness and with relatively high heat resistance can be used here.

Finite element method (FEM) calculations have shown that a carrier plate of CVD diamond about 2 mm thick and a rear-side supporting structure of tungsten carbide have a mechanical resistance to a thermally induced bending of the laser disk that is approximately equal to a carrier plate of CVD diamond about 10 mm thick that is not supported on the rear side. Furthermore, the FEM calculations have shown that a carrier plate of polycrystalline diamond composite (PDC) about 2 mm thick and a rear-side supporting structure of tungsten carbide have a mechanical resistance to thermally induced bending of the laser disk that is approximately equal to a carrier plate of CVD diamond about 3.4 mm thick that is not supported on the rear side.

The cutouts in the supporting structure may either be open toward the rear side of the carrier plate, so that the cooling liquid impinges directly on the rear side of the carrier plate (direct heat transfer of the carrier plate into the cooling liquid), or else be closed toward the rear side of the carrier plate, so that the cooling liquid impinges on a base of the carrier plate. In the latter case, direct contact between the cooling liquid and a solder located between the carrier plate and the supporting structure is avoided, and as a result, the risk of corrosion is reduced.

The carrier plate can be formed from diamond material (for example CVD diamond or polycrystalline diamond composite (PDC)) and has a thickness of at most 5 mm, e.g., at most 3 mm, or at most 2 mm. The diamond material offers high thermal conductivity and at the same time enough intrinsic stiffness to prevent the form of the laser disk that is mounted on the front side from being influenced significantly by the cooling structures on the rear side. Depending on the material pairing, the carrier plate and the supporting structure are soldered, glued, or sintered to one another or connected to one another by so-called bonding, e.g., by a mechanically load-bearing, rigid connection between two solid bodies without the formation of an intermediate layer.

In some embodiments, the rear side of the carrier plate is secured on the front side of a distributor plate, which has the cutouts, wherein the rear side of the distributor plate is secured on a supporting body, which has the feed and return lines. The supporting body can be formed from ceramic or hard metal and has a thickness of at least 1 cm, e.g., between 2 cm and 10 cm. Advantageously, the cutouts extend as through-openings to the rear side of the distributor plate. Alternatively, the distributor plate may also have upstream of its cutouts nozzle openings that are directed toward the rear side of the carrier plate, typically at right angles with respect to the rear side of the carrier plate. The distributor plate can be formed either from diamond material or from ceramic or hard metal (for example tungsten carbide or aluminum nitride), and have a thickness of at least 0.3 mm, e.g., at least 0.5 mm.

The cutouts in the distributor plate may be open toward the rear side of the carrier plate, and extend as through-openings from the front side to the rear side of the distributor plate, so that the cooling liquid impinges on the rear side of the carrier plate, or else be closed by a base of the distributor plate, so that the cooling liquid impinges on the base of the distributor plate.

In some embodiments, arranged between the distributor plate and the supporting body is a nozzle plate with nozzle openings, which connect the feed lines of the supporting body respectively to the cutouts in the distributor plate and are aligned in the direction of the rear side of the carrier plate, e.g., at right angles with respect to the rear side of the carrier plate, and with through-openings, which connect the cutouts in the distributor plate to the return lines. Through the nozzle opening, the cooling liquid is made to impinge at an accelerated rate on the rear side of the carrier plate. The nozzle plate can be formed from diamond material (for example CVD or PDC diamond), ceramic or hard metal (for example tungsten carbide or aluminum nitride) and has a thickness of at least 0.3 mm, e.g., at least 0.5 mm.

Depending on the material pairing, the individual components of the supporting structure are respectively soldered, for example by copper-based and/or silver-based hard solder, or else glued, sintered or bonded to one another.

In other embodiments, the rear side of the carrier plate has the cutouts and is secured on the front side of a supporting body, which has the feed lines and return lines. A carrier plate of CVD diamond can be provided with the cutouts for bearing the impact of the impingement flow on the rear side, for example by laser machining, and then a shaft, for example of tungsten carbide, can be soldered onto the structured rear side with hard solder. Subsequently, the required feed and return lines can be introduced into the tungsten carbide by spark erosion. Alternatively, the supporting body can also be made of individual perforated disks that are cut to size by a laser and soldered together to form a stack and the holes of which are in line with one another to form continuous feed and return lines in the stack.

The supporting body can be formed from ceramic or hard metal (for example tungsten carbide or aluminum nitride) and has a thickness of at least 0.5 cm, e.g., between 0.5 cm and 10 cm, to increase the stiffness of the carrier plate to a sufficient extent.

In some embodiments, the feed and return lines in the supporting body are formed by through-channels, that are introduced, for example drilled, into the supporting body next to one another. In some embodiments, the feed lines in the supporting body are, by contrast, respectively formed by a separate tube (for example nozzle needle), arranged in a through-channel of the supporting body to form an (annular) gap. The return lines in the supporting body are respectively formed by the (annular) gap that is present between the through-channel and the tube. In this case, the feed line is surrounded by just one single return line in the form of a ring or part-ring, which in the case of a return line in the form of a ring results in a homogeneous spatial distribution of the cooling. Alternatively, the return lines may conversely also be respectively formed by a separate tube (for example nozzle needle) in a through-channel of the supporting body and the feed lines may be respectively formed by the (annular) gap that is present between the through-channel and the tube.

Each of the feed lines is surrounded by a plurality of return lines, e.g., point-symmetrically in relation to the feed line, wherein the return lines in turn lead away from that cutout in the distributor plate into which the feed line surrounded by them leads. In other words, a plurality of return lines are assigned to each feed line, which results in a homogeneous spatial distribution of the cooling. However, an inhomogeneous spatial distribution of the cooling, for example due to only one return line per feed line, may also be used if the material of the carrier plate allows sufficient heat spreading within the carrier plate.

Advantageously, the feed and return lines run parallel to one another in the longitudinal direction of the supporting structure, e.g., in the case of a supporting body in the direction of the thickness thereof.

In some embodiments, a laser disk module with an impingement cooling device formed as described herein has a laser disk that is secured on the front side of the carrier plate of the impingement cooling device.

Further advantages and advantageous refinements of the subject matter of the invention emerge from the description, the claims and the drawing. Similarly, the features mentioned above and features still to be set out can each be used on their own or together in any desired combinations. The embodiments shown and described should not be understood as an exhaustive list, but rather are of an exemplary character for the description of the invention.

In the following detailed description, identical reference signs are used for components that are the same or functionally the same in the figures.

DETAILED DESCRIPTION

Figure 1A:
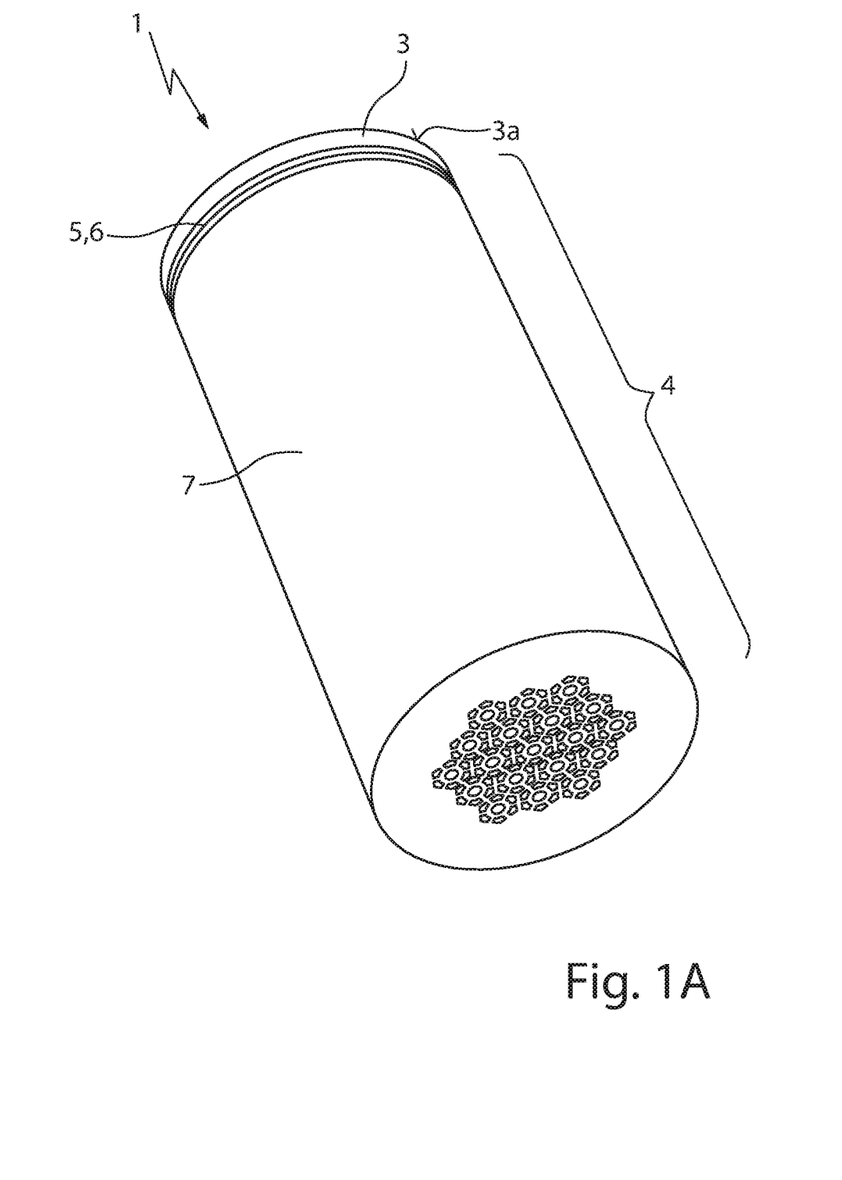
FIGS. 1A, 1B show a first exemplary embodiment of the impingement cooling device for a laser disk in the mounted state (FIG. 1A) and in an exploded view (FIG. 1B).
Figure 1B:
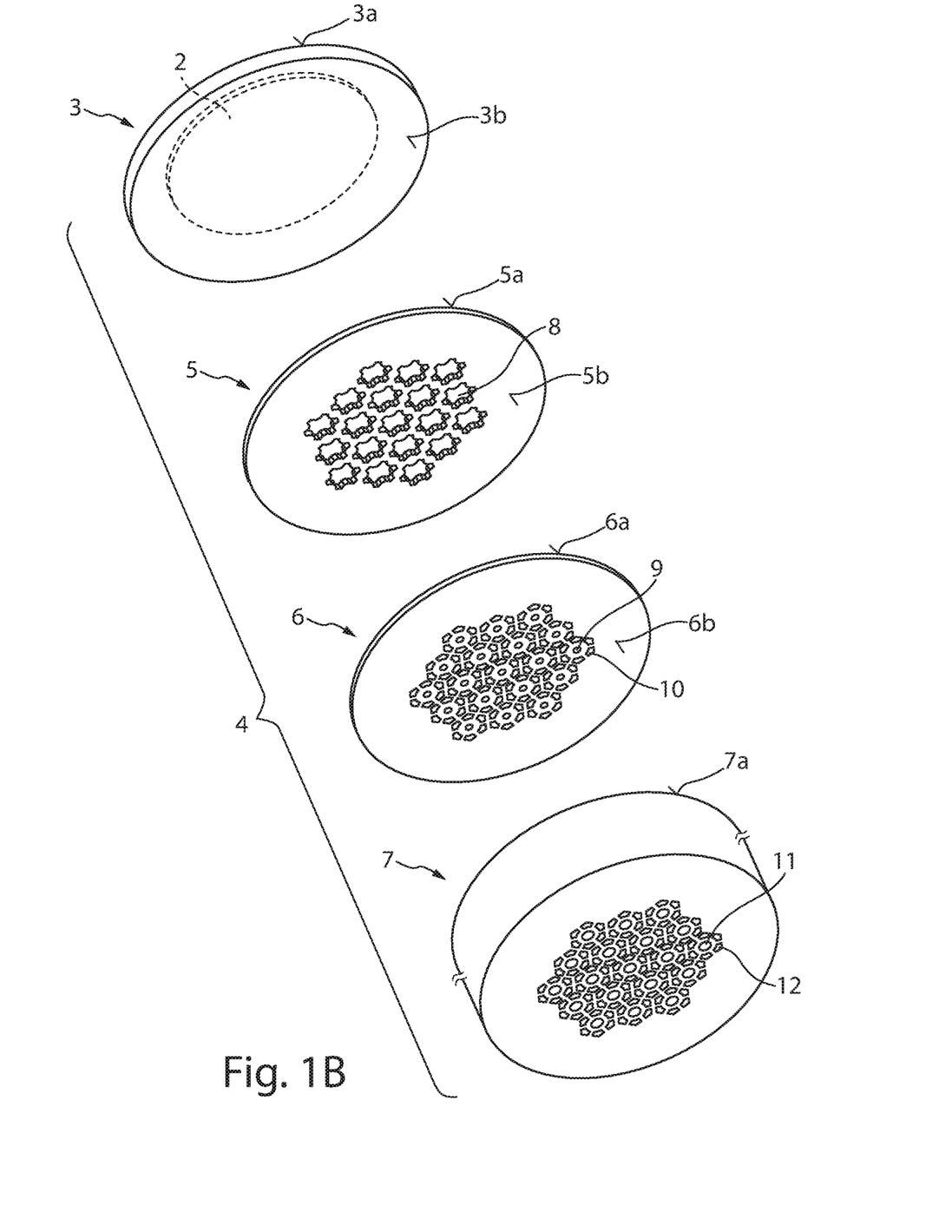

The impingement cooling device 1 shown in FIGS. 1A and 1B serves for cooling a laser disk 2 of a disk laser (not shown) by a cooling liquid. The laser disk 2 is formed from laser-active gain material and may be for example a Yb:YAG, Yb:LuAG, Yb:YAG, Yb:YLF, Yb:Lu$_2$O$_3$, Yb:LuAG, Yb:CALGO, Nd:YAG, or Nd:YVO$_4$ crystal with a thickness of about 50 μm to about 500 μm.

The impingement cooling device 1 includes a disk-shaped carrier plate 3, on the front side 3a of which is secured a laser disk 2, and a rear-side supporting structure 4, on which the rear side 3b of the carrier plate 3 is secured. The supporting structure 4 has a disk-shaped distributor plate 5, a disk-shaped nozzle plate 6 and a cylindrical supporting body (supporting block) 7 with a diameter of about 25-40 mm. The rear side 3b of the carrier plate 3 is secured on the front side 5a of the distributor plate 5, the rear side 5b of which is in turn secured on the front side 6a of the nozzle plate 6. The rear side 6b of the nozzle plate 6 is secured on the front side 7a of the supporting body 7.

The carrier plate 3 is formed from a diamond material, for example from CVD diamond or polycrystalline diamond composite (PDC), which has a high thermal conductivity and at the same time a sufficiently great intrinsic stiffness to avoid significant influencing of the form of the laser disk 2 mounted on the front side 3a by rear-side cooling structures. Typically, the carrier plate 3 is about 2-4 mm thick.

The distributor plate 5 has a plurality of cutouts 8 that are open both toward the rear side 3b of the carrier plate 3 and the front side 6a of the nozzle plate 6, which therefore extend as through-openings from the front side 5a to the rear side 5b of the distributor plate 5. To optimize the cooling characteristics, the distributor plate 5 may likewise be formed from a diamond material (for example CVD or PDC diamond) or alternatively from ceramic or hard metal (for example tungsten carbide or aluminum nitride). Typically, the distributor plate 5 is about 0.5 mm thick.

The nozzle plate 6 is formed from ceramic or hard metal and has a plurality of small nozzle openings 9 and a plurality of through-channels 10, wherein each nozzle opening 9 is surrounded by a plurality of through-channels 10. The nozzle openings 9 are respectively directed at right angles to the rear side of the carrier plate 3. Typically, the nozzle plate 6 is about 0.5 mm thick.

The supporting body 7 is formed from ceramic or hard metal (for example tungsten carbide or aluminum nitride) and has a plurality of cooling liquid feed and return lines 11, 12 formed as through-channels, with a line diameter of 0.3-5 mm (e.g., 3 mm), that run parallel to one another in the direction of the thickness of the supporting body 7. Each feed line 11 is surrounded by a plurality of return lines 12, here, by way of example, six. Each feed line 11 leads via one of the nozzle openings 9 in the nozzle plate 6 into one of the cutouts 8 in the distributor plate 5. From each cutout 8 there lead away in turn via the through-channels 10 of the nozzle plate 5 to the six return lines 12 that surround the feed line 11 leading into this cutout 8. Typically, the supporting body 7 is between 0.5 cm and 10 cm thick.

Depending on the material pairing, soldering, gluing, sintering, or bonding processes are used to connect the individual components 3 and 5-7 of the impingement cooling device 1. When choosing solder, compatibility between the solder and the cooling circuit with respect to corrosion should be considered. Typically, therefore—and also because of their strong adhesive bonding, high strength, and stiffness—copper-based and/or silver-based solders are used.

Figure 2:
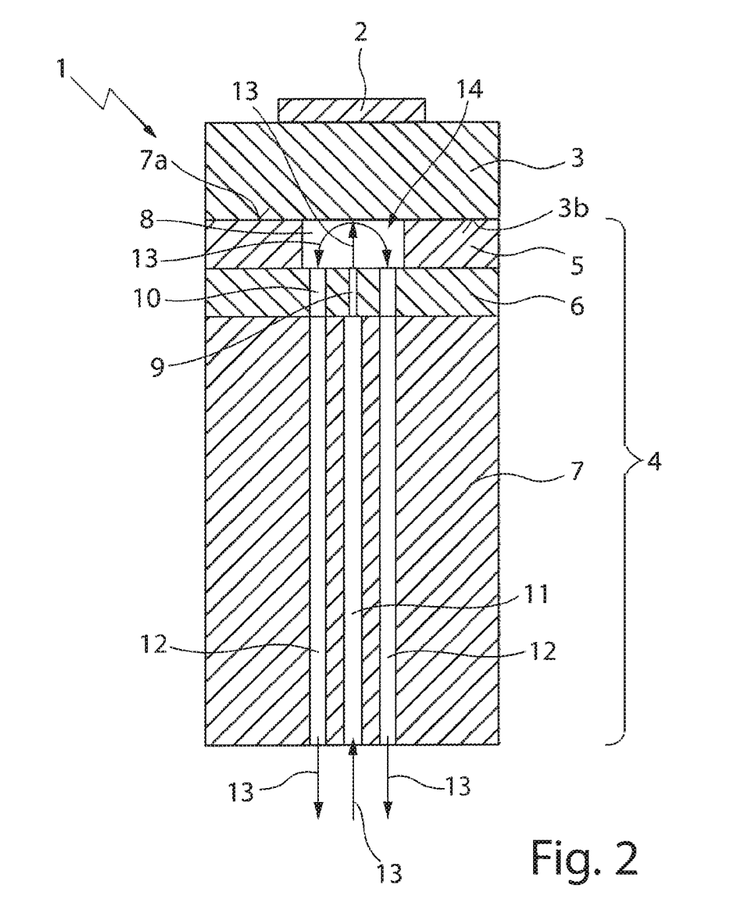
FIG. 2 shows a schematic longitudinal section through the impingement cooling device of FIG. 1 in the region of a feed line arranged between two return lines.

As shown schematically in FIG. 2 for a single feed line 11 and two return lines 12, cooling liquid 13 flows into the impingement cooling device 1 via the feed line 11 of the supporting body 7 to the nozzle openings 9 in the nozzle plate 5. Since the opening cross section of the nozzle opening 9 is smaller than the line cross section of the feed line 11, the cooling liquid 13 emerges from the nozzle opening 9 at an accelerated rate into the cutout 8 and impinges there on the rear side 3b of the carrier plate 3, which is thereby cooled. This impingement cooling is denoted in FIG. 2 overall by impingement area 14. The cooling liquid 13 bounces back then flows further within the cutout 8 radially outward and via the through-channels 10 of the nozzle plate 6 into the return lines 12 of the supporting body 7.

Figure 3:
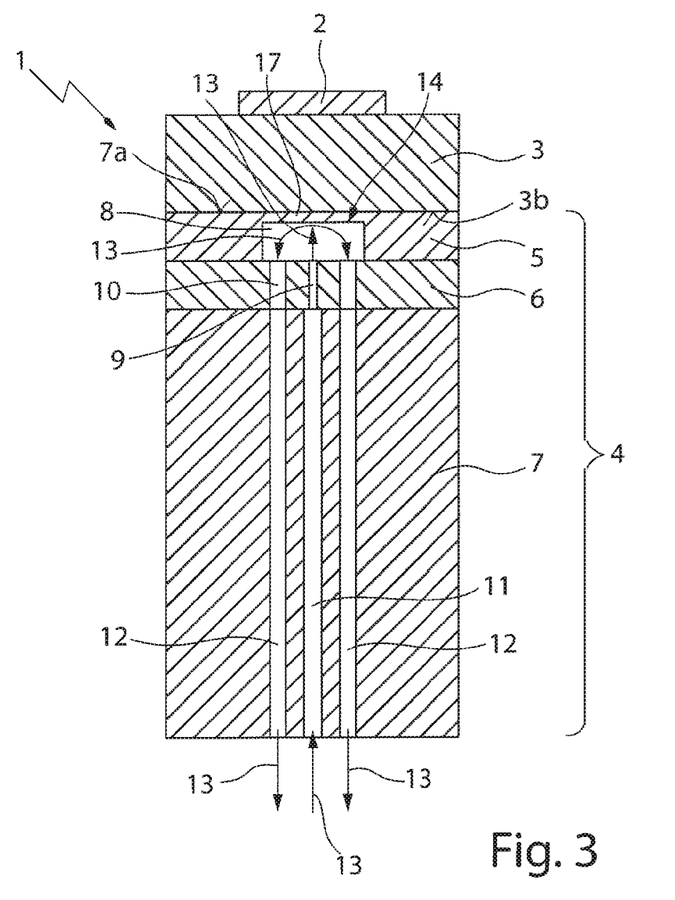
FIG. 3 shows a second exemplary embodiment of the impingement cooling device in a schematic longitudinal section analogous to FIG. 2.

The impingement cooling device 1 shown in FIG. 3 differs from FIG. 2 in that here the cutout 8 in the distributor plate 5 is closed toward the rear side 3b of the carrier plate 3 by a base 17 of the distributor plate 5. The cooling liquid 13 impinges on the base 17 of the distributor plate 3, so that the carrier plate 3 is not cooled directly by the cooling liquid 13, but indirectly via the base 17 of the distributor plate 3. Direct contact between the cooling liquid 13 and a solder located between the carrier plate 3 and the distributor plate 5 is thereby avoided and the risk of corrosion is reduced.

Figure 4:
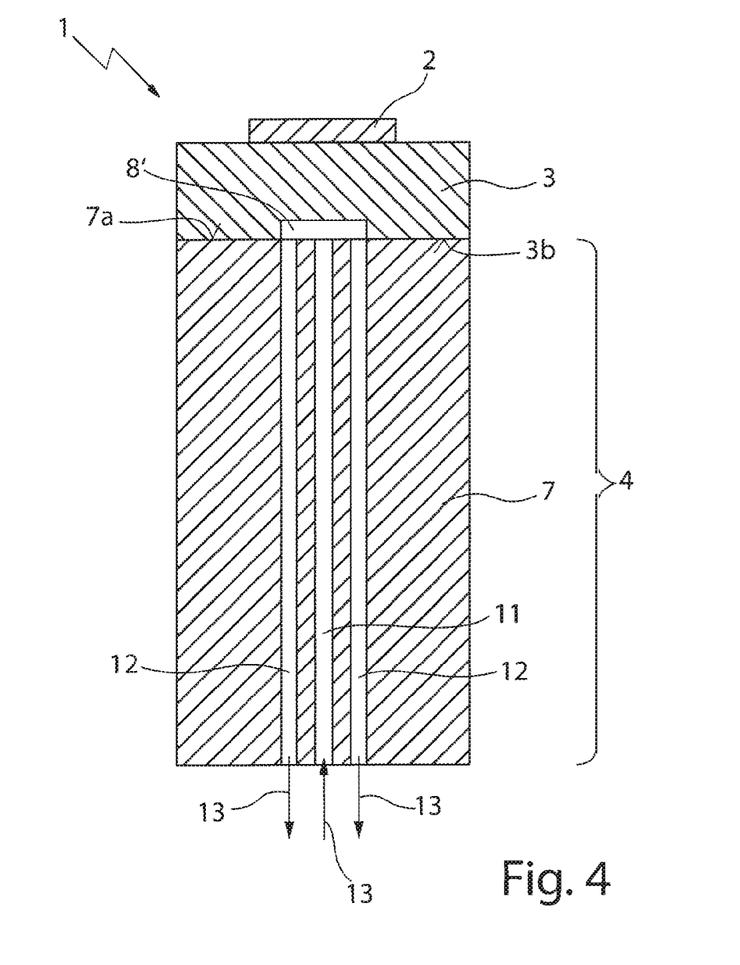
FIG. 4 shows a third exemplary embodiment of the impingement cooling device in a schematic longitudinal section analogous to FIG. 2.

The impingement cooling device 1 shown in FIG. 4 differs from the devices shown in FIGS. 2 and 3 in that here the rear side 3b of the carrier plate 3 has the cutout 8', which is open toward the front side 7a of the supporting body 7, and is secured directly on the front side 7a of the supporting body 7. The feed line 11 leads into the cutout 8' in the carrier plate 3, from which, in turn, the return lines 12 lead away. The cooling liquid 13 emerges from the feed line 11 directly into the cutout 8' and impinges there on the rear side 3b of the carrier plate 3, which is thereby cooled.

The cutout 8' is introduced into the rear side 3b of the carrier plate 3 for example by laser machining. This structured rear side 3b of the carrier plate 3 is then soldered onto the front side 7a of the supporting body 7 by hard solder. Finally, the required feed and return lines 11, 12 are introduced into the supporting body 7 by spark erosion. Alternatively, the supporting body 7 may also be made up of individual perforated disks that are cut to size by a laser and soldered together to form a stack and the holes of which are in line with one another, to form the continuous feed and return lines 11, 12 in the stack.

Figure 5:
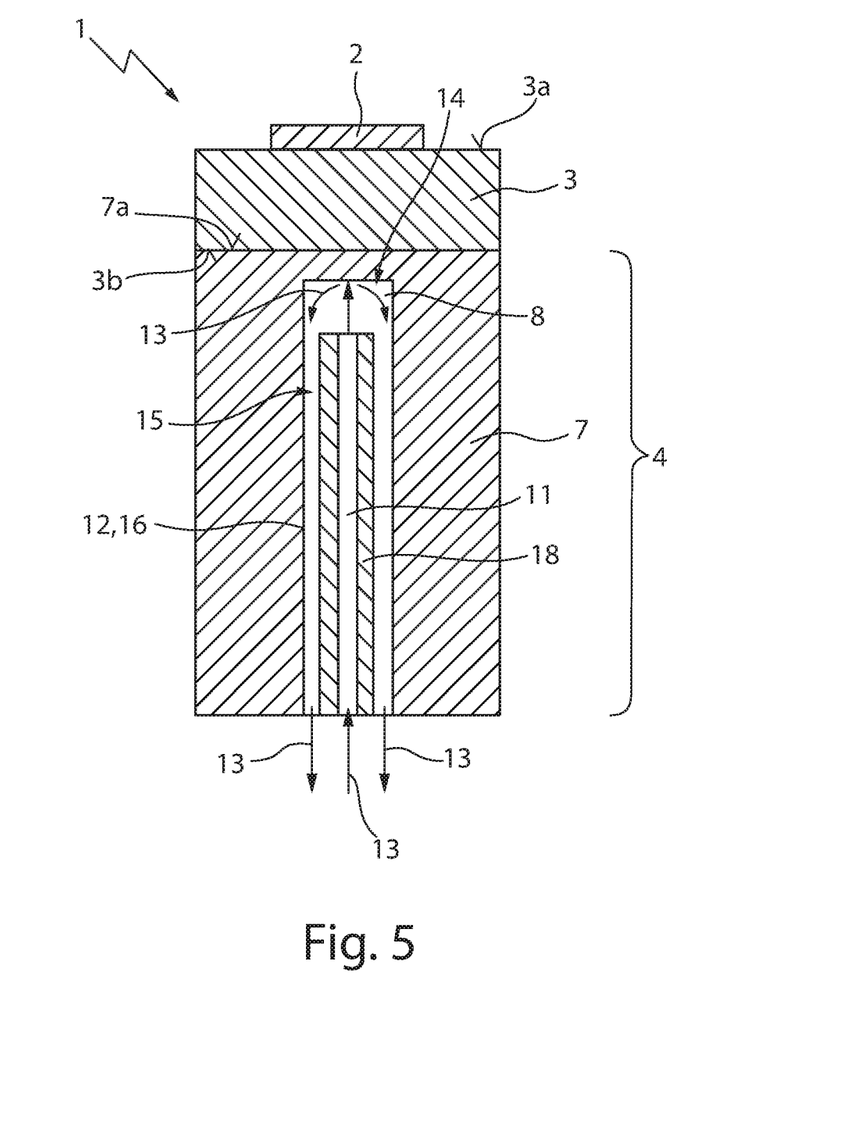
FIG. 5 shows a fourth exemplary embodiment of the impingement cooling device in a schematic longitudinal section analogous to FIG. 2.

The impingement cooling device 1 shown in FIG. 5 differs from FIG. 2 in that the feed line 11 in the supporting body 7 is formed by a separate, free-standing tube 18 (for example of high-grade steel) arranged in a through-channel 15 of the supporting body 7 to form an annular gap 16. In the supporting body 7 there runs only a single return line 12 that is formed by the annular gap 16 that is present between the tube 18 and the through-channel 15. The tube 18 reaches with its one, free end up to the cutout 8' and is secured at its other, fixed end on the rear side of the supporting body 7. Alternatively, the distributor plate 5 of FIG. 3 or the carrier plate 3 of FIG. 4 may also be used.

OTHER EMBODIMENTS

A number of embodiments of the invention have been described. Nevertheless, it will be understood that various modifications may be made without departing from the spirit and scope of the invention. Accordingly, other embodiments are within the scope of the following claims.

What is claimed is:

1. An impingement cooling device for a laser disk, the impingement cooling device comprising:
   a carrier plate configured to secure the laser disk on a front side and having a rear side;
   an impingement cooling area for indirectly cooling the carrier plate by a cooling liquid; and
   a supporting structure secured on a front side thereof to the rear side of the carrier plate, wherein the supporting structure comprises a supporting body comprising:
      a plurality of cooling liquid feed lines from which the cooling liquid emerges towards the rear side of the carrier plate, and a plurality of cooling liquid return lines, wherein the feed and return lines run parallel to one another in a longitudinal direction of the supporting structure, and a plurality of close-ended inner cutouts in a region adjoining the rear side of the carrier plate that are closed toward the rear side of the carrier plate and prevent fluid contact with the carrier plate, wherein the cooling liquid feed lines lead into the plurality of cutouts and the cooling liquid return lines lead away from the plurality of cutouts and wherein the feed lines are each formed by a separate tube that is arranged in a through-channel of the supporting body, and the return lines in the supporting body are respectively formed by an annular gap between the through-channel and the tube, or vice versa.

2. The impingement cooling device of claim 1, wherein the carrier plate is disk-shaped.

3. The impingement cooling device of claim 1, wherein cooling liquid emerges towards the rear side of the carrier plate at right angles with respect to the rear side of the carrier plate.

4. The impingement cooling device of claim 1, wherein the carrier plate is formed from diamond material and has a thickness of at most 5 mm.

5. The impingement cooling device of claim 1, wherein the carrier plate is formed from diamond material and has a thickness of at most 3 mm.

6. The impingement cooling device of claim 1, wherein the carrier plate is formed from diamond material and has a thickness of at most 2 mm.

7. The impingement cooling device of claim 1, wherein the supporting body is formed from ceramic or hard metal and has a thickness of at least about 0.5 cm.

8. The impingement cooling device of claim 7, wherein the supporting body is formed from ceramic or metal and has a thickness of between about 0.5 cm and about 10 cm.

9. The impingement cooling device of claim 1, wherein the carrier plate and the supporting structure are respectively soldered, glued, sintered, or bonded to one another.

10. A laser disk module with an impingement cooling device of claim 1 and with a laser disk that is secured on the front side of the carrier plate of the impingement cooling device.

* * * * *